United States Patent
Arimatsu

(10) Patent No.: US 10,281,828 B2
(45) Date of Patent: May 7, 2019

(54) EXPOSURE METHOD

(71) Applicant: KABUSHIKI KAISHA TOKAI RIKA DENKI SEISAKUSHO, Aichi (JP)

(72) Inventor: Kento Arimatsu, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 15/981,272

(22) Filed: May 16, 2018

(65) Prior Publication Data
US 2018/0335688 A1    Nov. 22, 2018

(30) Foreign Application Priority Data
May 22, 2017    (JP) .................................. 2017-100775

(51) Int. Cl.
*G03F 7/20*     (2006.01)
*G03F 9/00*     (2006.01)
*G03B 27/34*    (2006.01)
*G03B 27/53*    (2006.01)

(52) U.S. Cl.
CPC ........ *G03F 7/70641* (2013.01); *G03F 9/7026* (2013.01); *G03B 27/34* (2013.01); *G03B 27/53* (2013.01)

(58) Field of Classification Search
None
See application file for complete search history.

(56) References Cited

U.S. PATENT DOCUMENTS 6,341,007 B1 *  1/2002  Nishi .................. G03F 7/70216
                                                                  355/53

FOREIGN PATENT DOCUMENTS

JP    2003257818 A2 *  9/2003
JP    2016-206654       12/2016

* cited by examiner

*Primary Examiner* — Michelle M Iacoletti
(74) *Attorney, Agent, or Firm* — Greenblum & Bernstein, P.L.C.

(57) ABSTRACT

An exposure method includes, in a case of exposing unmeasurable shots which are arranged linearly and whose focus value cannot be measured and a measurable shot which is adjacent to the unmeasurable shots and whose focus value can be measured, exposing alternately the measurable shot and the unmeasurable shots such that the unmeasurable shots are exposed using the focus value of the adjacent measurable shot exposed immediately before the unmeasurable shots.

7 Claims, 3 Drawing Sheets

EXPOSURE METHOD

BACKGROUND

Technical Field

The present invention relates to an exposure method.

Related Art

As a related technique, an exposure method is known in which an exposure order is determined so that in the first substrate in a lot, in a case where a height cannot be measured at three or more measurement points in an exposure region located at an end in a predetermined arrangement direction, a different exposure region where a height can be measured at three or more measurement points is exposed first, and then in the second substrate in the lot, an exposure region located at an end is exposed first (see JP 2016-206654 A, for example).

SUMMARY

In the related art, in a case where, for example, sequential measurement points cannot be measured, there may be an increased distance between the exposure region in which a measurement point was last measured and the exposure region to be exposed next, which can lead to a deviation in focus.

Accordingly, an object of the invention is to provide an exposure method that can reduce problems caused by a deviation in focus.

One aspect of the invention provides an exposure method including, in a case of exposing unmeasurable shots arranged linearly and for which focus values cannot be measured and exposing measurable shots adjacent to the unmeasurable shots and for which focus values can be measured, exposing the measurable shots and the unmeasurable shots in an alternating manner by exposing each unmeasurable shot using a focus value of a measurable shot that is adjacent to the unmeasurable shot and exposed immediately before the unmeasurable shot.

According to an aspect of the invention, problems caused by a deviation in focus can be reduced.

DESCRIPTION OF EMBODIMENTS

Overview of Embodiments

An exposure method according to an embodiment includes, in a case of exposing unmeasurable shots arranged linearly and for which focus values cannot be measured and exposing measurable shots adjacent to the unmeasurable shots and for which focus values can be measured, exposing the measurable shots and the unmeasurable shots in an alternating manner by exposing each unmeasurable shot using a focus value of a measurable shot that is adjacent to the unmeasurable shot and exposed immediately before the unmeasurable shot.

According to this exposure method, each unmeasurable shot for which a focus value cannot be measured is exposed using, as the focus value, the focus value of an adjacent measurable shot exposed immediately before the unmeasurable shot. Thus, compared to a case where this method is not employed, exposure is not carried out using focus values from distant locations, and thus this exposure method can reduce problems caused by focus deviation.

Embodiment

Overview of Exposure Device 1

Figure 1A:
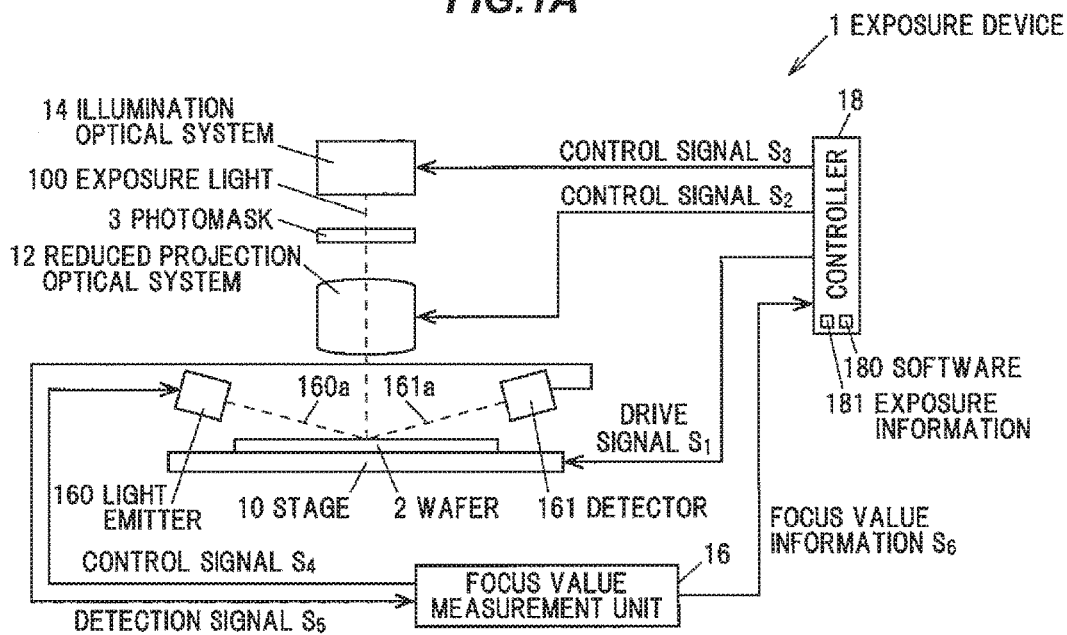
FIG. 1A is a schematic diagram illustrating an example of an exposure device according to an embodiment.
Figure 1B:
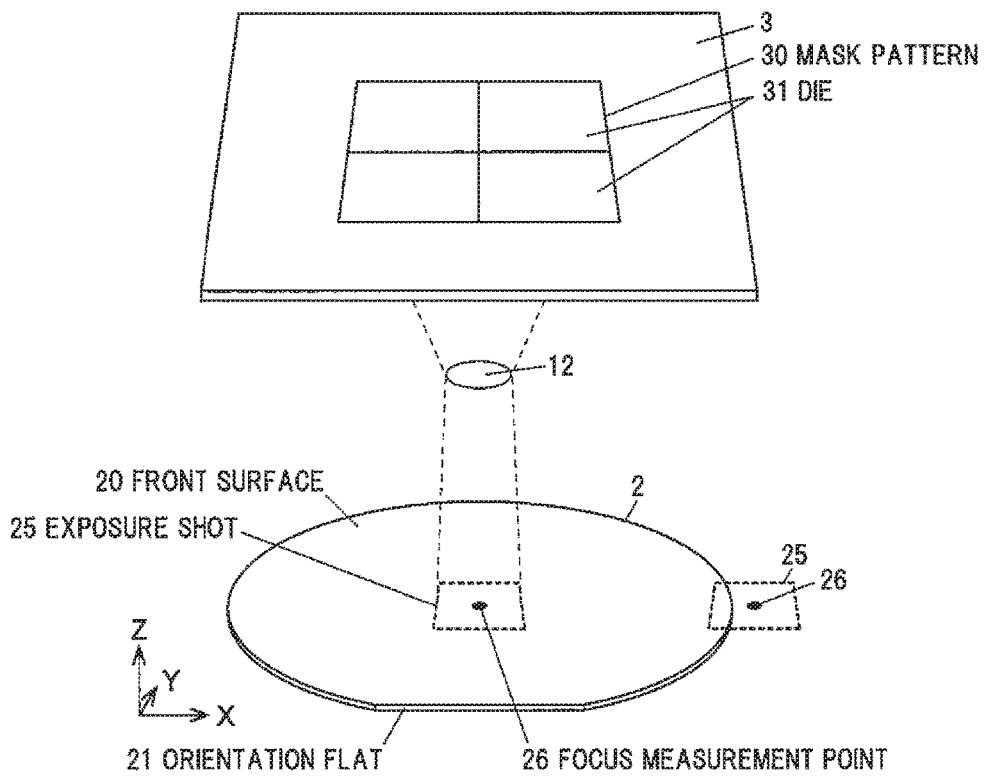
FIG. 1B is a schematic diagram illustrating an example of exposure.
Figure 2A:
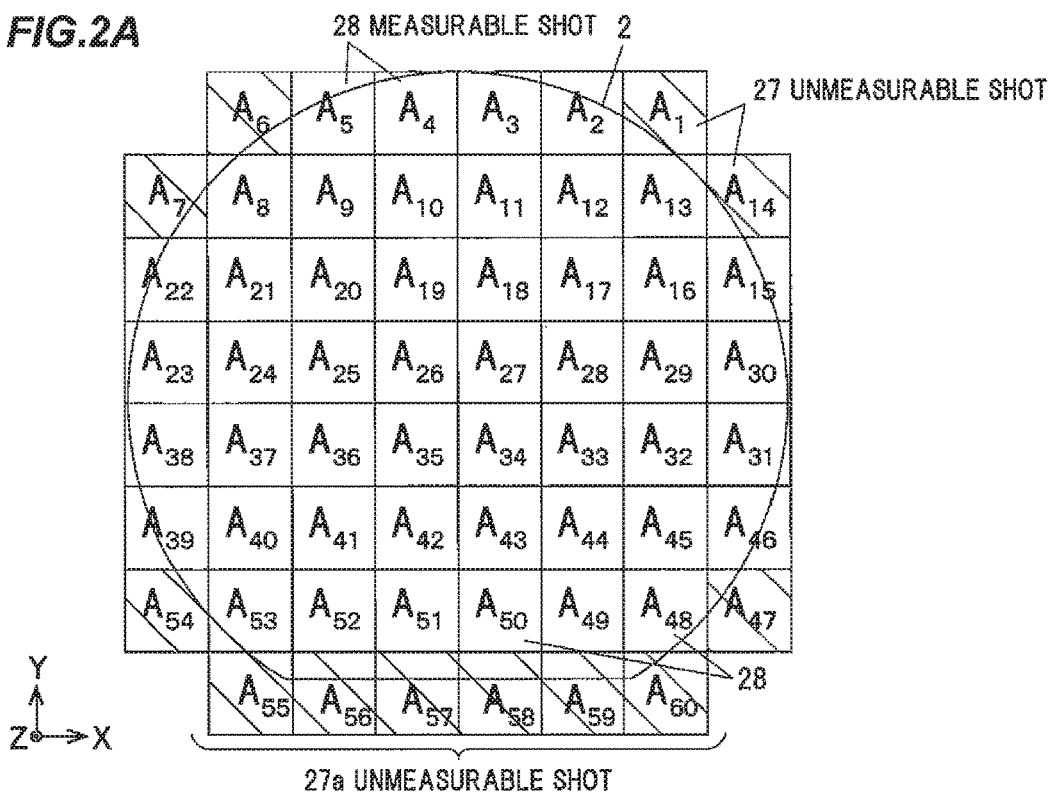
FIG. 2A is a schematic diagram illustrating an example of measurable shots and unmeasurable shots in the exposure device according to the embodiment.
Figure 2B:
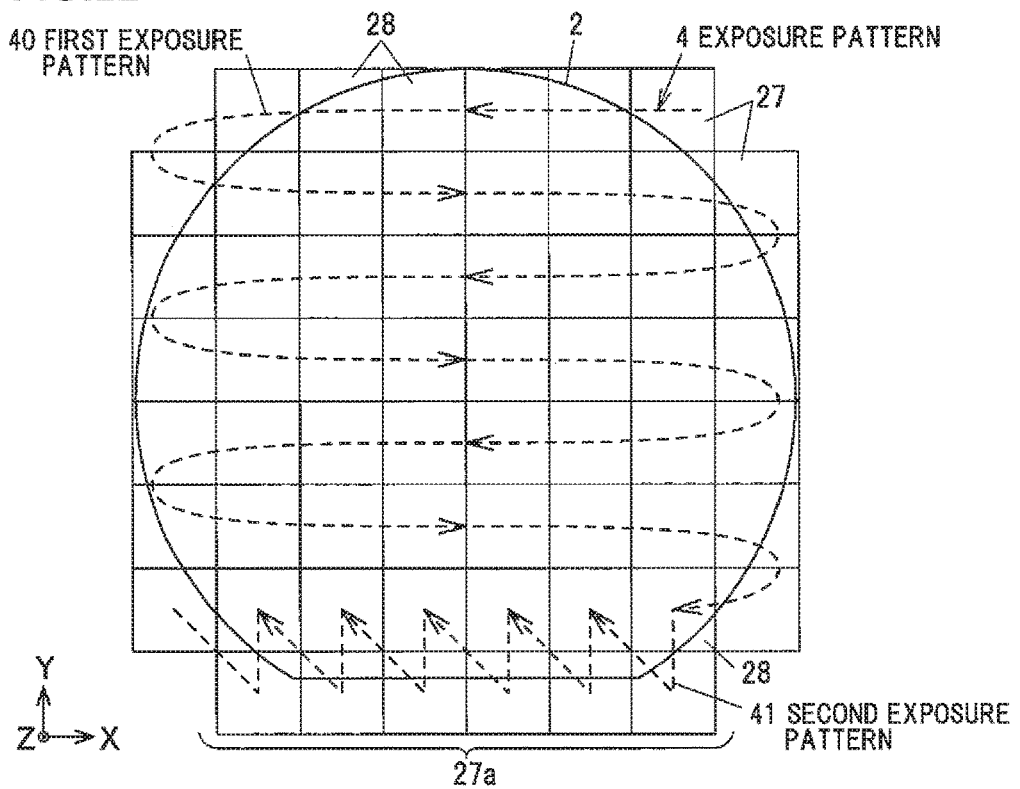
FIG. 2B is a schematic diagram illustrating an example of exposure patterns.

FIG. 1A is a schematic diagram illustrating an example of an exposure device according to an embodiment, and FIG. 1B is a schematic diagram illustrating an example of exposure. FIG. 2A is a schematic diagram illustrating an example of measurable shots and unmeasurable shots in the exposure device according to the embodiment, and FIG. 2B is a schematic diagram illustrating an example of exposure patterns. In the drawings associated with the following embodiments, ratios between elements in the drawings may be different from the actual ratios. In addition, in FIG. 1A, arrows indicate the flows of primary signals, information, and the like. Furthermore, the XYZ coordinate system illustrated in FIG. 1B and the like is an orthogonal coordinate system indicating directions in which a wafer 2 and a photomask 3 move relative to each other.

As illustrated in FIGS. 1A and 1B, for example, the exposure device 1 uses exposure light 100 to project, at a reduced size, a mask pattern 30 formed on the photomask 3 onto a resist film formed on a front surface 20 of the wafer 2. The smallest unit of this reduced projection is an exposure shot 25.

The exposure shot 25 is achieved by projecting, at a reduced size, a plurality of dies 31 formed in the photomask 3, for example. In other words, the mask pattern 30 is a pattern obtained by enlarging the plurality of dies 31.

As illustrated in FIG. 2A, the exposure shot 25 is made a plurality of times across the entirety of the wafer 2, for example. In the example described in the present embodiment, signs $A_1$ to $A_{60}$ are assigned to the exposure shots 25 corresponding to 60 exposures. Thus, in the following, when discussing an exposure shot 25 corresponding to $A_n$ (where $1 \leq n \leq 60$), the shot will be referred to as "exposure shot $A_n$". As one example, the signs are assigned so that in FIG. 2A, exposure shot $A_1$ to exposure shot $A_{60}$ progress in order from the right to the left, then onto the next row, and then from the left to the right.

Additionally, as illustrated in FIG. 1B, the exposure device 1 determines a focus measurement point 26 for measuring a focus value of the exposure shot 25 to be exposed, for example. The exposure device 1 carries out exposure on the basis of the focus value measured using the focus measurement point 26.

As illustrated in FIGS. 1A and 1B, the exposure device 1 is generally configured of a stage 10, a reduced projection optical system 12, an illumination optical system 14, and a focus value measurement unit 16, for example.

The exposure device 1 further includes a controller 18 that carries out exposure using an exposure method in which, when exposing linearly-arranged unmeasurable shots 27a for which focus values cannot be measured and measurable shots 28 that are adjacent to the unmeasurable shots 27a and for which focus values can be measured, the measurable shot 28 and the unmeasurable shot 27a are exposed in an alternating manner by exposing each unmeasurable shot 27a using the focus value of the adjacent measurable shot 28 that was exposed immediately before the unmeasurable shot 27a, as illustrated in FIGS. 2A and 2B, for example.

The linearly-arranged unmeasurable shots 27a for which the focus value cannot be measured are, for example, exposure shots 25 in which an orientation flat 21 is present, as illustrated in FIGS. 2A and 2B. In each unmeasurable shot 27a, the focus measurement point 26 is not located on the wafer 2, and thus the focus value cannot be measured. In addition to the unmeasurable shots 27a, the exposure shots 25 indicated by hatching in FIG. 2A are unmeasurable shots 27 in which the focus value cannot be measured.

Configuration of Wafer 2

The wafer 2 is formed in a disk-like shape using a silicon-based material, for example. As illustrated in FIG. 1B, the orientation flat 21, which serves as an indicator of the crystal orientation of the silicon, is formed in the wafer 2, for example.

Configuration of Photomask 3

The photomask 3 is formed, for example, by forming a light-blocking film of a metal such as chromium or a halftone film on a transparent substrate formed of silica glass or the like, and forming, in the light-blocking film, a mask pattern that is to be transferred.

Configuration of Stage 10

The wafer 2 is placed on the stage 10. The stage 10 moves in the X, Y, and Z directions on the basis of a drive signal $S_1$ outputted from the controller 18.

Configuration of Reduced Projection Optical System 12

The reduced projection optical system 12 includes, for example, a plurality of overlapping optical lenses, and projects the mask pattern 30 at a reduced size as the exposure shot 25. The reduced projection optical system 12 adjusts the focus by, for example, adjusting the relative positions of the lenses on the basis of a control signal $S_2$ outputted from the controller 18.

Configuration of Illumination Optical System 14

The illumination optical system 14 includes a light source such as a mercury lamp, an integrator lens that increases the uniformity of the intensity of the exposure light 100 outputted from the light source, and the like. The exposure light 100 is an ArF excimer laser or a KrF excimer laser, for example.

The illumination optical system 14 outputs the exposure light 100 on the basis of a control signal $S_3$ outputted from the controller 18, for example.

Configuration of Focus Value Measurement Unit 16

The focus value measurement unit 16 is configured to measure the focus value for each exposure shot 25. As one example, the focus value measurement unit 16 measures the focus value at the focus measurement point 26 in the center of the exposure shot 25, as indicated in FIG. 1B. Note that the number of exposure shots 25 may be more than one.

As illustrated in FIG. 1A, a light emitter 160 and a detector 161 are electrically connected to the focus value measurement unit 16, for example. The light emitter 160 includes, for example, a light source that outputs detection light 160a onto the focus measurement point 26 on the basis of a control signal S4 outputted from the focus value measurement unit 16. The detection light 160a outputted from the light emitter 160 is light at a wavelength to which the resist film formed on the front surface 20 of the wafer 2 is not sensitive. In a case where, for example, a plurality of focus measurement points 26 are set, the light emitter 160 includes light sources corresponding to the number of focus measurement points 26.

The detector 161 detects reflected light 161a reflected from the focus measurement point 26.

The detector 161 then outputs, to the focus value measurement unit 16, a detection signal $S_5$, which is information of the detected reflected light 161a.

The focus value measurement unit 16 finds a reflectivity by comparing the detection light 160a outputted from the light emitter 160 with the reflected light 161a detected by the detector 161, and finds the focus value on the basis of the reflectivity. The focus value measurement unit 16 generates focus value information $S_6$, which is information of the focus value that has been found, and outputs that information to the controller 18.

Configuration of Controller 18

The controller 18 is, for example, a microcomputer including a Central Processing Unit (CPU) that carries out computations, processes, and the like on acquired data in accordance with stored programs, Random Access Memory (RAM) and Read Only Memory (ROM) that are semiconductor memories, and the like. Software 180 for operations of the controller 18 and exposure information 181, for example, are stored in the ROM. The RAM is used as a storage region that temporarily stores computation results and the like, for example.

The software 180 is software for executing the measurement of focus values, exposure processes, and the like, and is run by the controller 18.

The exposure information 181 is information such as parameters required for exposure processes, and the positions, focus values, and exposure patterns 4 of the exposure shots 25. The exposure patterns 4 will be described hereinafter.

As illustrated in FIGS. 2A and 2B, the exposure patterns 4 include a first exposure pattern 40 and a second exposure pattern 41, for example. As will be described later, the controller 18 is configured to expose the exposure shots 25 arranged linearly on the basis of the first exposure pattern 40, and then expose the measurable shots 28 and the unmeasurable shots 27a in an alternating manner on the basis of the second exposure pattern 41.

The first exposure pattern 40 is a pattern, of the exposure patterns 4, having a linear exposure path. The exposure device 1 repeats focus value measurements and exposure using those focus values on the basis of this first exposure pattern 40. The exposure path is the path indicated by the dotted line in FIG. 2B, for example.

As illustrated in FIGS. 2A and 2B, this linear exposure path is a path in which, for example, exposure shot $A_1$ to exposure shot $A_6$, exposure shot $A_7$ to exposure shot $A_{14}$, exposure shot $A_{15}$ to exposure shot $A_{22}$, exposure shot $A_{23}$ to exposure shot $A_{30}$, exposure shot $A_{31}$ to exposure shot $A_{38}$, and exposure shot $A_{39}$ to exposure shot $A_{46}$ are exposed in that order.

In exposure shot $A_1$, the focus measurement point 26 is located outside the wafer 2, and thus this exposure shot is an unmeasurable shot 27 for which the focus value cannot be measured. Exposure shot $A_1$ is exposed using a predetermined default focus value, the focus value from exposure shot $A_2$ or exposure shot $A_{13}$, which are adjacent measurable shots 28, or the like, for example.

Exposure shot $A_2$ to exposure shot $A_5$ are measurable shots 28, and thus for these shots, the focus values are measured and the shots are exposed using those focus values.

Exposure shot $A_6$ is an unmeasurable shot 27, and thus the focus value cannot be measured; the shot is thus exposed using the focus value of exposure shot $A_5$, which is an adjacent measurable shot 28.

Exposure shot $A_7$, where the exposure path switches back, is an unmeasurable shot 27. Exposure shot $A_7$ is exposed using, for example, the focus value of exposure shot $A_6$, which is the immediately-previous exposure shot, or in other words, the focus value of exposure shot $A_5$, or using the focus value of the adjacent exposure shot $A_5$. Exposure shot $A_8$ is exposed after exposure shot $A_7$, and thus from the standpoint of efficiency, it is preferable that the focus value of exposure shot $A_7$ be the focus value of exposure shot $A_6$, or in other words, the focus value of exposure shot $A_5$. Note that "adjacent" refers to the four exposure shots 25 located in the periphery.

The second exposure pattern 41 is, as illustrated in FIG. 2B, a pattern having a zig-zag exposure path, for example. The controller 18 is configured to expose, on the basis of the second exposure pattern 41, the measurable shots 28 and the unmeasurable shots 27a in an alternating manner by exposing the unmeasurable shots 27a, for which the focus values cannot be measured consecutively, using the focus values of the adjacent measurable shots 28 exposed immediately before the unmeasurable shots 27a that are to be exposed.

The "unmeasurable shots 27a for which the focus values cannot be measured consecutively" are, for example, exposure shot $A_{55}$ to exposure shot $A_{60}$, including the orientation flat 21, indicated in FIGS. 2A and 2B.

When, for example, the controller 18 exposes exposure shot $A_{47}$ to exposure shot $A_{60}$ linearly as per the first exposure pattern 40, exposure shot $A_{54}$ to exposure shot $A_{60}$, for which the focus values cannot be measured, are exposed using the focus value of exposure shot $A_{53}$, which is the last shot for which the focus value has been measured. As a result, for example, exposure shot $A_{57}$ to exposure shot $A_{60}$, which are not adjacent to exposure shot $A_{53}$ in the eight spaces in the periphery thereof, are exposed using the focus value of exposure shot $A_{53}$, which is non-adjacent and several shots away. It is thus easy for problems to arise due to focus deviation caused by the effects of warping in the wafer 2, the driving correctness of the stage 10, variations in the resist film, and the like.

Thus, in the present embodiment, for example, exposure shot $A_{60}$ is exposed using the focus value of the exposed exposure shot $A_{48}$, exposure shot $A_{59}$ is exposed using the focus value of the exposed exposure shot $A_{49}$, exposure shot $A_{58}$ is exposed using the focus value of the exposed exposure shot $A_{50}$, exposure shot $A_{57}$ is exposed using the focus value of the exposed exposure shot $A_{51}$, exposure shot $A_{56}$ is exposed using the focus value of the exposed exposure shot $A_{52}$, and exposure shot $A_{55}$ and exposure shot $A_{54}$ are exposed using the focus value of the exposed exposure shot $A_{53}$, as illustrated in FIG. 2B.

In other words, the controller 18 exposes exposure shot $A_{48}$, exposure shot $A_{60}$, exposure shot $A_{49}$, exposure shot $A_{59}$, exposure shot $A_{50}$, exposure shot $A_{58}$, exposure shot $A_{51}$, exposure shot $A_{57}$, exposure shot $A_{52}$, exposure shot $A_{56}$, exposure shot $A_{53}$, exposure shot $A_{55}$, and exposure shot $A_{54}$ in that order.

The controller 18 exposes exposure shot $A_{55}$ to exposure shot $A_{60}$, which are unmeasurable shots 27a and in which the orientation flat 21 is present, exposure shot $A_{48}$ to exposure shot $A_{53}$, which are measurable shots 28 adjacent to the stated unmeasurable shots 27a, and exposure shot $A_{54}$, which is an unmeasurable shot 27, using the second exposure pattern 41.

Figure 3:
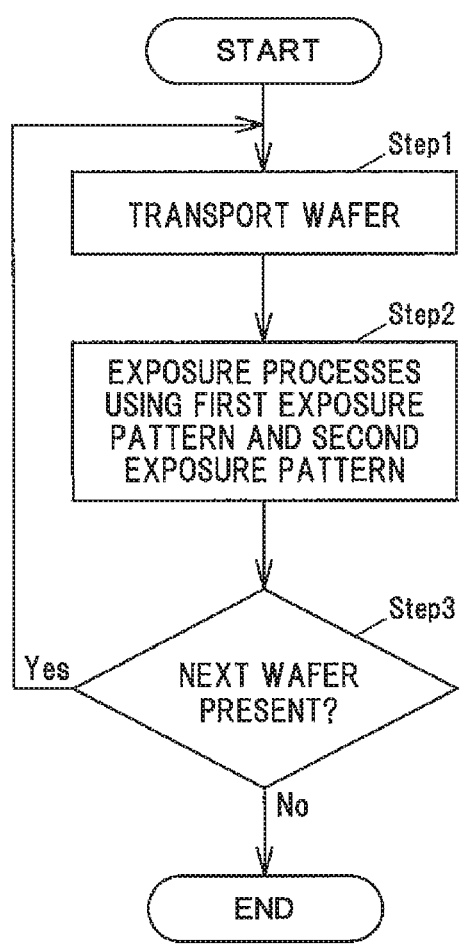
FIG. 3 is a flowchart illustrating an example of an exposure method of the exposure device according to the embodiment.

An exposure method of the exposure device 1 according to the present embodiment will be described next according to the flowchart in FIG. 3.

Once the wafer 2 on which a resist film is formed is transported (Step 1), the controller 18 of the exposure device 1 carries out exposure processes using the first exposure pattern 40 and the second exposure pattern 41 on the basis of the exposure information 181 (Step 2). Specifically, the controller 18 repeats focus value measurement and exposure using those focus values on the basis of the first exposure pattern 40 which, of the predetermined exposure patterns 4, has a linear exposure path. Next, the controller 18 exposes, on the basis of the second exposure pattern 41 which, of the exposure patterns 4, has a zig-zag exposure path, the measurable shots 28 and the unmeasurable shots 27a in an alternating manner by exposing the unmeasurable shots 27a, for which the focus values cannot be measured consecutively, using the focus values of the adjacent measurable shots 28 exposed immediately before the unmeasurable shots 27a that are to be exposed.

Once the exposures of exposure shot $A_1$ to exposure shot $A_{60}$ are complete, the controller 18 confirms whether a next wafer 2 is present or absent. In a case where there is a wafer 2 to undergo the exposure process next (Step 3: Yes), the controller 18 returns the process to step 1 and transports the next wafer 2.

In a case where, in Step 3, there is no wafer 2 to undergo the exposure process next (Step 3: No), the controller 18 ends the exposure process.

Effect of Embodiments

The exposure device 1 employing the exposure method according to the present embodiment can reduce problems caused by deviations in focus. With this exposure method, even in a case where there are unmeasurable shots 27a in which the orientation flat 21 is present and for which the focus values cannot be measured, those unmeasurable shots 27a can be exposed using the focus values of adjacent measurable shots 28. Thus, compared to exposure using the focus values of distant exposure shots, focus deviation is suppressed and problems caused by focus deviation can be reduced.

Compared to a device that creates a focus map in advance by measuring focus values and then carries out exposure according to the created focus map, the exposure device 1 does not require a storage region having a capacity capable of storing a focus value for each exposure shot 25, storing the focus map, and the like, which reduces the cost of manufacturing the device.

Although an embodiment of the invention has been described above, this embodiment is merely an example and the invention according to claims is not to be limited thereto. This novel embodiment may be implemented in various other forms, and various omissions, substitutions, changes, and the like can be made without departing from the spirit and scope of the invention. In addition, all the combinations of the features described in this embodiment are not necessarily needed to solve the problem of the invention. Furthermore, this embodiment is included within the spirit and scope of the invention and also within the invention described in the claims and the scope of equivalents thereof.

REFERENCE SIGNS LIST

1 Exposure device
2 Wafer
3 Photomask
4 Exposure pattern
10 Stage
12 Reduced projection optical system
14 Illumination optical system
16 Focus value measurement unit
18 Controller
20 Front surface
21 Orientation flat
25 Exposure shot
26 Focus measurement point
27 Unmeasurable shot
27a Unmeasurable shot
28 Measurable shot
30 Mask pattern
31 Die
40 First exposure pattern
41 Second exposure pattern
100 Exposure light
160 Light-emitter
160a Detection light
161 Detector
161a Reflected light
180 Software
181 Exposure information

What is claimed is:

1. An exposure method, comprising,
in a case of exposing unmeasurable shots, which are arranged linearly and whose focus value cannot be measured, and a measurable shot, which is adjacent to the unmeasurable shots and whose focus value can be measured,
exposing the measurable shot between the exposure of the unmeasurable shots such that the unmeasurable shots are exposed using the focus value of the adjacent measurable shot exposed immediately before the unmeasurable shots.

2. The exposure method according to claim 1,
wherein the unmeasurable shots, which are arranged linearly and whose focus value cannot be measured, comprise exposure shots in which an orientation flat is included.

3. The exposure method according to claim 1,
wherein exposure shots arranged linearly are exposed based on a first exposure pattern; and
wherein the measurable shot and one of the unmeasurable shots are alternately exposed based on a second exposure pattern.

4. An exposure method, comprising:
repeating measurement of a focus value and exposure using the focus value based on a first exposure pattern of predetermined exposure patterns that has a linear exposure path; and
exposing, based on a second exposure pattern of the predetermined exposure patterns that has a zig-zag exposure path, alternately measurable shots and unmeasurable shots by exposing the unmeasurable shots whose focus value cannot be measured consecutively in a linear direction by using focus values of the measurable shots that are adjacent to the unmeasurable shots and exposed immediately before the unmeasurable shots that are to be exposed.

5. The exposure method according to claim 4,
wherein the unmeasurable shots whose focus value cannot be measured consecutively comprise exposure shots in which an orientation flat is included.

6. The exposure method according to claim 1,
wherein the focus value is measured at a predetermined focus measurement point in an exposure shot projected onto a resist film formed on a front surface of a wafer, and
wherein the unmeasurable shots are detected when the predetermined focus measurement point is located in the front surface of the wafer.

7. The exposure method according to claim 4,
wherein the focus value is measured at a predetermined focus measurement point in an exposure shot projected onto a resist film formed on a front surface of a wafer, and
wherein the unmeasurable shots are detected when the predetermined focus measurement point is located in the front surface of the wafer.

* * * * *